US012516412B2

(12) United States Patent
Obata et al.

(10) Patent No.: US 12,516,412 B2
(45) Date of Patent: Jan. 6, 2026

(54) METHOD FOR ESTIMATING REMAINING AMOUNT OF SOLID RAW MATERIAL, METHOD FOR FORMING FILM, DEVICE FOR FEEDING RAW MATERIAL GAS, AND DEVICE FOR FORMING FILM

(71) Applicant: TOKYO ELECTRON LIMITED, Tokyo (JP)

(72) Inventors: Yuji Obata, Nirasaki (JP); Eiichi Komori, Nirasaki (JP); Makoto Yoshida, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 161 days.

(21) Appl. No.: 18/246,788

(22) PCT Filed: Sep. 16, 2021

(86) PCT No.: PCT/JP2021/034129
§ 371 (c)(1),
(2) Date: Mar. 27, 2023

(87) PCT Pub. No.: WO2022/070955
PCT Pub. Date: Apr. 7, 2022

(65) Prior Publication Data

US 2023/0366084 A1 Nov. 16, 2023

(30) Foreign Application Priority Data

Sep. 30, 2020 (JP) ................................ 2020-166244

(51) Int. Cl.
*C23C 16/448* (2006.01)
*C23C 16/52* (2006.01)

(52) U.S. Cl.
CPC .......... *C23C 16/4481* (2013.01); *C23C 16/52* (2013.01)

(58) Field of Classification Search
CPC .............. C23C 16/448; C23C 16/4481; C23C 16/4485; C23C 16/52
See application file for complete search history.

(56) References Cited

U.S. PATENT DOCUMENTS 6,772,072 B2 * 8/2004 Ganguli .............. C23C 16/4481 427/248.1
2019/0177849 A1 * 6/2019 Mo ......................... C23C 16/52

FOREIGN PATENT DOCUMENTS

JP 2014-145115 A 8/2014
JP 2019-104974 A 6/2019

* cited by examiner

*Primary Examiner* — Michael P Wieczorek
(74) *Attorney, Agent, or Firm* — Nath, Goldberg & Meyer; Jerald L. Meyer; Tanya E. Harkins

(57) ABSTRACT

A method includes: obtaining a raw material by heating and sublimating a solid raw material accommodated in a raw material container; supplying, as a raw material gas, the sublimated raw material together with a carrier gas to a consumption region; adjusting a heating temperature of the solid raw material based on a measurement result of an amount of the raw material in the raw material gas; converting a supply amount of the raw material per unit time into a reference temperature supply amount; and estimating a remaining amount of the solid raw material corresponding to the reference temperature supply amount based on a remaining amount-raw material supply amount curve, which indicates a relationship between the remaining amount of the solid raw material in the raw material container and the raw material supply amount when the solid raw material is heated at a reference temperature.

20 Claims, 8 Drawing Sheets

METHOD FOR ESTIMATING REMAINING AMOUNT OF SOLID RAW MATERIAL, METHOD FOR FORMING FILM, DEVICE FOR FEEDING RAW MATERIAL GAS, AND DEVICE FOR FORMING FILM

This is a National Phase Application filed under 35 U.S.C. 371 as a national stage of PCT/JP2021/034129, filed Sep. 16, 2021, an application claiming the benefit of Japanese Patent Application No. 2020-166244, filed Sep. 30, 2020, the content of each of which is hereby incorporated by reference in its entirety.

TECHNICAL FIELD

The present disclosure relates to a method for estimating a remaining amount of a solid raw material, a method for forming a film, a device for feeding a raw material gas, and a device for forming a film.

BACKGROUND

As a method for forming a film on a substrate such as a semiconductor wafer (hereinafter referred to as a "wafer"), a chemical vapor deposition (CVD) method and an atomic layer deposition (ALD) method are known. These methods are performed by supplying a raw material gas into a processing container in which a vacuum atmosphere is formed and a wafer is accommodated.

When supplying a raw material gas by using a sublimable solid raw material, the raw material gas (a mixed gas of the raw material and a carrier gas) is supplied to a processing container, for example, by heating the raw material accommodated in a raw material container to sublimate the raw material and transporting the raw material with the carrier gas introduced into the raw material container.

At this time, since the raw material container is housed in a cabinet equipped with a heater, there may be a case where a remaining amount of the solid raw material cannot be determined directly and visually. However, in order to use the solid raw material accommodated in the raw material container without waste, it is necessary to accurately determine the remaining amount of the solid raw material.

Patent Document 1 discloses a technique for obtaining a flow rate of a raw material based on a difference between a measured flow rate of a raw material gas containing the vaporized raw material and a carrier gas and a measured flow rate of the carrier gas. In addition, Patent Document 2 discloses a technique for adjusting a flow rate of a carrier gas such that a flow rate of a vaporized raw material reaches a target value, while updating a correction coefficient as a ratio of the flow rates of the vaporized raw material and the carrier gas, which are contained in the raw material gas, according to the number of processed substrates.

However, neither Patent Document 1 nor Patent Document 2 discloses a technique for specifying a remaining amount of a solid raw material in a raw material container.

PRIOR ART DOCUMENTS

Patent Documents

Patent Document 1: Japanese Patent Laid-Open Publication No. 2014-145115

Patent Document 2: Japanese Patent Laid-Open Publication No. 2019-104974

The present disclosure provides a technique for estimating a remaining amount of a solid raw material in a raw material container where a raw material is obtained by sublimating the solid raw material.

SUMMARY

A method of estimating a remaining amount of a solid raw material in a raw material container according to the present disclosure includes:

- an act of obtaining a raw material by heating the solid raw material accommodated in the raw material container to sublimate the solid raw material;
- an act of supplying a carrier gas into the raw material container to supply the carrier gas together with the sublimated raw material as a raw material gas to a consumption region;
- an act of adjusting a heating temperature of the solid raw material based on a result obtained by measuring an amount of the raw material in the raw material gas supplied to the consumption area;
- an act of converting a supply amount of the raw material per unit time into a reference temperature supply amount, which is a supply amount of the raw material per unit time when the solid raw material is heated at a preset reference temperature; and
- an act of estimating the remaining amount of the solid raw material corresponding to the reference temperature supply amount based on a remaining amount-raw material supply amount curve, which is acquired in advance and indicates a relationship between the remaining amount of the solid raw material in the raw material container and the raw material supply amount when the solid raw material is heated at the reference temperature.

According to the present disclosure, it is possible to estimate a remaining amount of a solid raw material in a raw material container where a raw material is obtained by sublimating the solid raw material.

DETAILED DESCRIPTION

Figure 1:
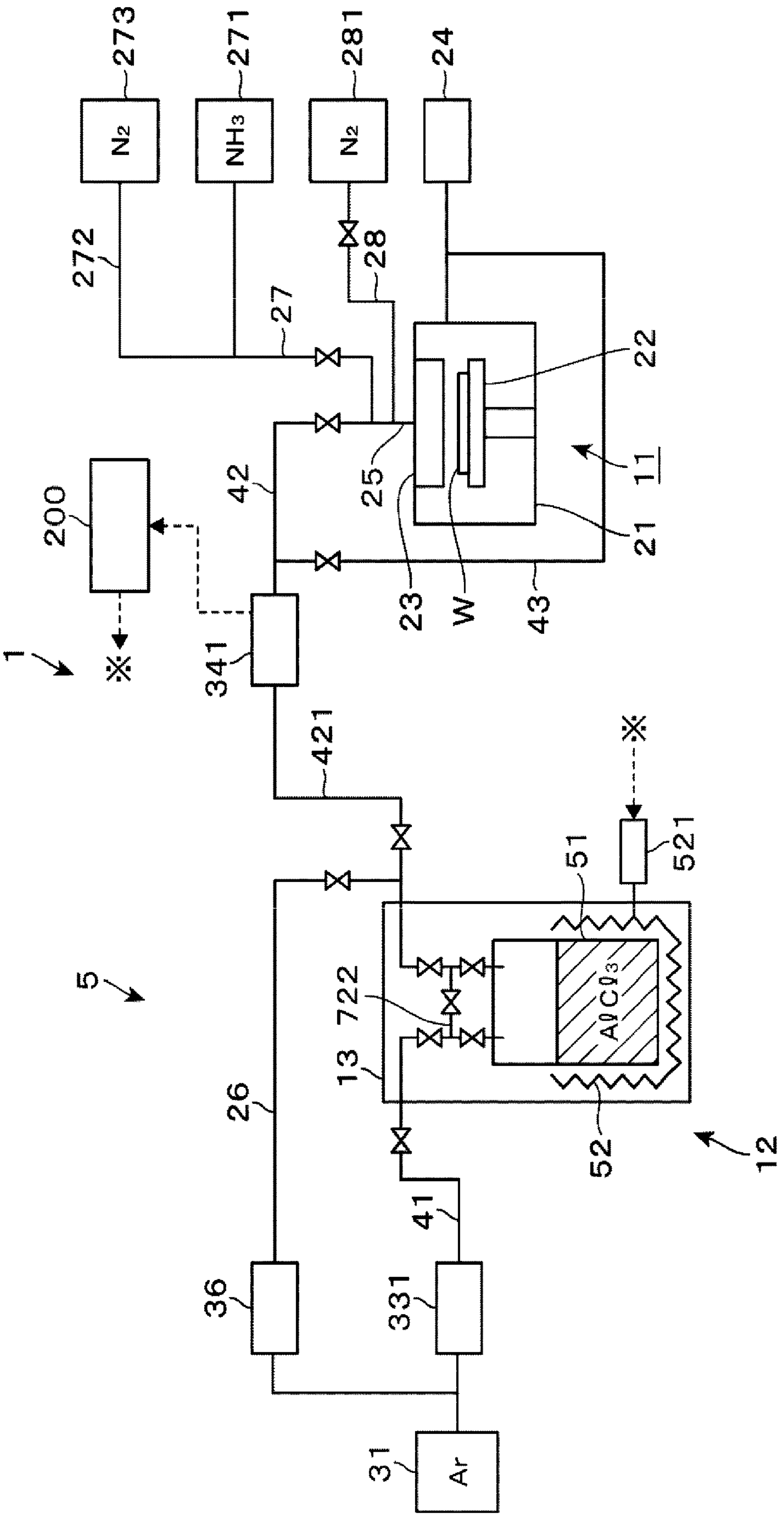
FIG. 1 is a configuration view of a film forming system provided with a raw material gas supply apparatus of the present disclosure.

Hereinafter, an outline of a film forming system 1 including an apparatus for supplying a raw material gas (a raw material gas supply apparatus 12) and an apparatus for forming a film on a wafer W (a film forming apparatus 11) according to an embodiment will be described with reference to FIG. 1. The film forming system 1 includes the film forming apparatus 11, which has a function of performing a film forming process, for example, by an ALD method on the wafer W as a substrate and corresponds to a raw material gas consumption region, and the raw material gas supply apparatus 12 configured to supply the raw material gas to the film forming apparatus 11.

The film forming apparatus 11 is provided with, for example, a stage 22 including a heater (not illustrated) and configured to hold the wafer W horizontally within a processing container 21, which is, for example, a vacuum container, and a gas introducer 23 configured to introduce a raw material gas or the like into the processing container 21. The interior of the processing container 21 is evacuated by an evacuator 24 including a vacuum pump or the like. By introducing a raw material gas containing $AlCl_3$ as a raw material into the processing container 21 from the raw material gas supply apparatus 12, a film forming process for forming a film on a surface of the heated wafer W proceeds.

A gas supply path 25 is connected to the gas introducer 23, and a raw material gas supply path 42, which constitutes a part of the raw material gas supply apparatus 12 and is configured to supply the raw material gas toward the processing container 21, is connected to the gas supply path 25. In addition, a reaction gas flow path 27 configured to supply a reaction gas that reacts with the raw material gas and a replacement gas flow path 28 configured to supply a replacement gas are joined to the gas supply path 25.

In an example of forming an aluminum nitride (AlN) film on the wafer W, $AlCl_3$, which is a solid raw material at room temperature, is used as the raw material, and ammonia ($NH_3$) gas is used as the reaction gas (reducing gas) reacting with the raw material. An upstream side of the reaction gas flow path 27 is connected to a reaction gas source 271, and a gas flow path 272 is branched from the reaction gas flow path 27 and connected to an inert gas (e.g., nitrogen ($N_2$) gas) source 273. The other end of the replacement gas flow path 28 is connected to a replacement gas (e.g., $N_2$ gas) source 281.

In addition, a branch path 43 is branched from the raw material gas supply path 42, and a downstream end of the branch path 43 is connected to the evacuator 24.

A mass flow meter 341 configured to measure a flow rate of the raw material gas supplied to the film forming apparatus 11 is provided on an upstream side of the raw material gas supply path 42. A raw material gas supplier 5 is connected to an upstream side of the mass flow meter 341 via a raw material gas flow path 421.

The raw material gas supplier 5 includes: the raw material gas flow path 421 to which the raw material gas supply path 42 is connected on a downstream side thereof; a carrier gas introduction path 41 configured to introduce an inert gas, such as nitrogen ($N_2$) gas, as a carrier gas for the raw material; and a raw material container 51 provided at a position on an upstream side of the raw material gas flow path 421 and on a downstream side of the carrier gas introduction path 41, and configured to accommodate $AlCl_3$ as the solid raw material.

In addition, although illustrated in a simplified manner in FIG. 1, a plurality of, for example, two, raw material gas suppliers 5 may be connected in parallel to the film forming apparatus 11, and the raw material gas may be supplied while switching these raw material gas suppliers 5. In addition, each raw material gas supplier 5 may be provided with a plurality of, for example, two, raw material containers 51, and the raw material may be supplied from these raw material containers 51 in parallel.

An upstream end portion of the raw material gas flow path 421 is inserted into a gas phase portion in the raw material container 51.

The raw material container 51 is configured as a cylindrical container that accommodates, for example, 5 kg to 60 kg of $AlCl_3$, and a jacket-shaped heater 52 including, for example, a resistance heating element is attached to an outer wall surface of the raw material container 51. The heater 52 is connected to a power feeder 521 and may sublimate $AlCl_3$ by adjusting a temperature of heating the raw material container 51 based on a control signal from a controller 200, which will be described later. The raw material container 51 is housed in a cabinet 13 that constitutes a space insulated from outside.

In addition, the raw material container 51 is connected to the carrier gas introduction path 41 configured to introduce the carrier gas into the raw material container 51. A downstream end portion of the carrier gas introduction path 41 is inserted into the gas phase portion in the raw material container 51 so that the carrier gas can be introduced into the raw material container 51. A mass flow controller (MFC) 331 configured to adjust a flow rate of the carrier gas supplied to the raw material container 51 is interposed in the carrier gas introduction path 41, and an upstream end portion of the carrier gas introduction path 41 is connected to a carrier gas source 31.

In the present example, a case where Ar gas as an inert gas is used as the carrier gas supplied from the carrier gas source 31 is illustrated. However, any gas other than Ar gas (e.g., nitrogen gas) may be employed as an "inert gas" as long as the gas does not react with the raw material and does not affect the film forming process.

A bypass flow path 722 configured to bypass the raw material container 51 is provided at a position in a vicinity of the raw material container 51 inside the cabinet 13. The bypass flow path 722 is provided to bypass the raw material container 51 and to connect the carrier gas introduction path 41 and the raw material gas flow path 421 to each other.

In addition, the raw material container 51 is configured to be detachably attached with respect to the carrier gas introduction path 41 and the raw material gas flow path 421 so that the raw material container 51 in which the remaining amount of the raw material has decreased can be replaced with a new raw material container 51.

In addition to the above-described configuration, a dilution gas flow path 26 configured to supply a dilution gas to the raw material gas extracted from the raw material container 51 is connected to the carrier gas source 31 in parallel with the carrier gas introduction path 41. A mass flow controller 36 configured to adjust a flow rate of the dilution gas is interposed in the dilution gas flow path 26, and a downstream end portion of the dilution gas flow path 26 is connected to the raw material gas flow path 421 at a position on an upstream side of the mass flow meter 341.

As illustrated in FIG. 1, the film forming system 1 includes the controller 200. The controller 200 is configured with, for example, a computer including a CPU and a memory (not illustrated), and the memory stores a program in which a group of steps (instructions) for control associated with operations of the film forming system 1 is set up. The operations of the film forming system 1 includes a raw material gas supply operation using the raw material gas supply apparatus 12 and a film forming operation on the wafer W using the film forming apparatus 11. The program is stored in a memory medium such as a hard disk, a compact disk, a magnetic optical disk, or a memory card, from which the program is installed in the computer.

In the film forming system 1 having the above-described configuration, before explaining specific technical contents according to an embodiment, a simple flow of a film forming process using the film forming system 1 will be explained.

In the raw material gas supply apparatus 12, $AlCl_3$ accommodated in the raw material container 51 is heated and sublimated by using the heater 52 provided in the raw material gas supplier 5. The raw material gas is obtained by introducing the carrier gas from the carrier gas introduction path 41 into the raw material container 51 and causing the carrier gas and the $AlCl_3$ gas to join each other. Thereafter, a predetermined amount of dilution gas is supplied from the dilution gas flow path 26 to the raw material gas that has flowed out of the raw material container 51. As a result, the sublimated raw material is transported by the carrier gas, diluted with the dilution gas, and supplied as the raw material gas to the film forming apparatus 11. The raw material gas supplied to the film forming apparatus 11 is allowed to flow toward the evacuator 24 via the branch path 43.

In the film forming apparatus 11, the wafer W is placed on the stage 22, and then an interior of the processing container 21 is evacuated and the wafer W is heated. When preparations for film formation are completed as described above, a flow path of the raw material gas is switched to the gas supply path 25 and the raw material gas is introduced into the processing container 21 via the gas introducer 23.

When the raw material gas is supplied into the processing container 21, $AlCl_3$ is adsorbed on a surface of the wafer W. When forming an AlN film by an ALD method, the supply of the raw material gas to the processing container 21 is stopped after a predetermined period of time. During this period, the raw material gas is exhausted to the evacuator 24 via the branch path 43.

Subsequently, the replacement gas ($N_2$ gas) is supplied from the replacement gas flow path 28 to the processing container 21 to replace the gas in the processing container 21. Subsequently, when the reaction gas (a mixed gas of $NH_3$ gas and the inert gas) is supplied from the reaction gas flow path 27 to the processing container 21, $AlCl_3$ adsorbed on the wafer W reacts with $NH_3$ to form, for example, a monomolecular layer of an AlN film.

Thereafter, the supply of the reaction gas is stopped, and then the replacement gas is supplied to the processing container 21 to replace the gas in the processing container 21. By repeating a cycle of supplying the raw material gas containing $AlCl_3$, the replacement gas, the reaction gas, and the replacement gas into the processing container 21 as described above, an AlN film having a predetermined thickness is formed.

When the above-described film forming process is performed on a plurality of wafers W, the $AlCl_3$ in the raw material container 51 is consumed, so that the supply of the raw material gas continues by switching to the raw material gas supplier 5 (not illustrated) of another system connected in parallel to the film forming apparatus 11. In addition, the raw material container 51 in which the remaining amount of $AlCl_3$ has decreased is replaced with a new raw material container 51 filled with $AlCl_3$ after stopping the heating by the heater 52.

In replacing the raw material container 51 as described above, when usable $AlCl_3$ still remains in the raw material container 51, a disposal amount of $AlCl_3$ increases, thereby leading to a loss. Even in a case of recovering $AlCl_3$ and refilling the raw material container 51, costs according to necessary reprocessing involving recovery work and refilling are incurred.

In addition, as described in the Background section, the remaining amount of $AlCl_3$ in the raw material container 51 cannot be directly and visually determined in many cases. Therefore, conventionally, there were cases in which, based on a use period of the raw material container 51, the raw material container 51 was replaced when a preset period elapses from the initial use, without determining the remaining amount of $AlCl_3$.

In such cases, if an excessively long period is set in consideration of only complete use of $AlCl_3$, an amount of generation of the raw material may decrease when the remaining amount of $AlCl_3$ decreases, as will be described later. As a result, it may become difficult to supply a sufficient amount of the raw material to the raw material gas supply apparatus 12.

For such a reason, conventionally, the supply of the raw material to the raw material gas supply apparatus 12 was prioritized in many cases, and the use period was set such that the raw material container 51 is replaced even when there is a possibility that a certain amount of $AlCl_3$ remains in the raw material container 51.

Based on the above-described problems, the raw material gas supply apparatus 12 according to the present embodiment is configured such that the remaining amount of $AlCl_3$ in the raw material container 51 can be timely estimated and a replacement time of the raw material container 51 can be determined based on the estimation result of the remaining amount.

Hereinafter, details of a method of estimating the remaining amount of $AlCl_3$ will be described with reference to FIGS. 2 to 8.

In the raw material gas supply apparatus 12 of the present example, it may also be difficult to directly measure an amount of $AlCl_3$ sublimated in the raw material container 51 just as it is difficult to directly determine the remaining amount of $AlCl_3$ in the raw material container 51. Therefore, in the raw material gas supply apparatus 12 having the configuration illustrated in FIG. 1, a value obtained by subtracting flow rates of the carrier gas and the dilution gas that are set in the mass flow controllers 331 and 36, respectively, from a flow rate of the raw material gas ($AlCl_3$ gas+carrier gas+dilution gas) flowing through the raw material gas flow path 421 and measured by the mass flow meter 341 is used as a supply flow rate of the $AlCl_3$ (raw material).

Further, the method of measuring an amount of $AlCl_3$ in the raw material gas supplied to the raw material gas supply apparatus 12 is not limited to the above-described example. For example, an online analyzer may be used to measure a concentration of the $AlC_3$ gas.

Figure 2:
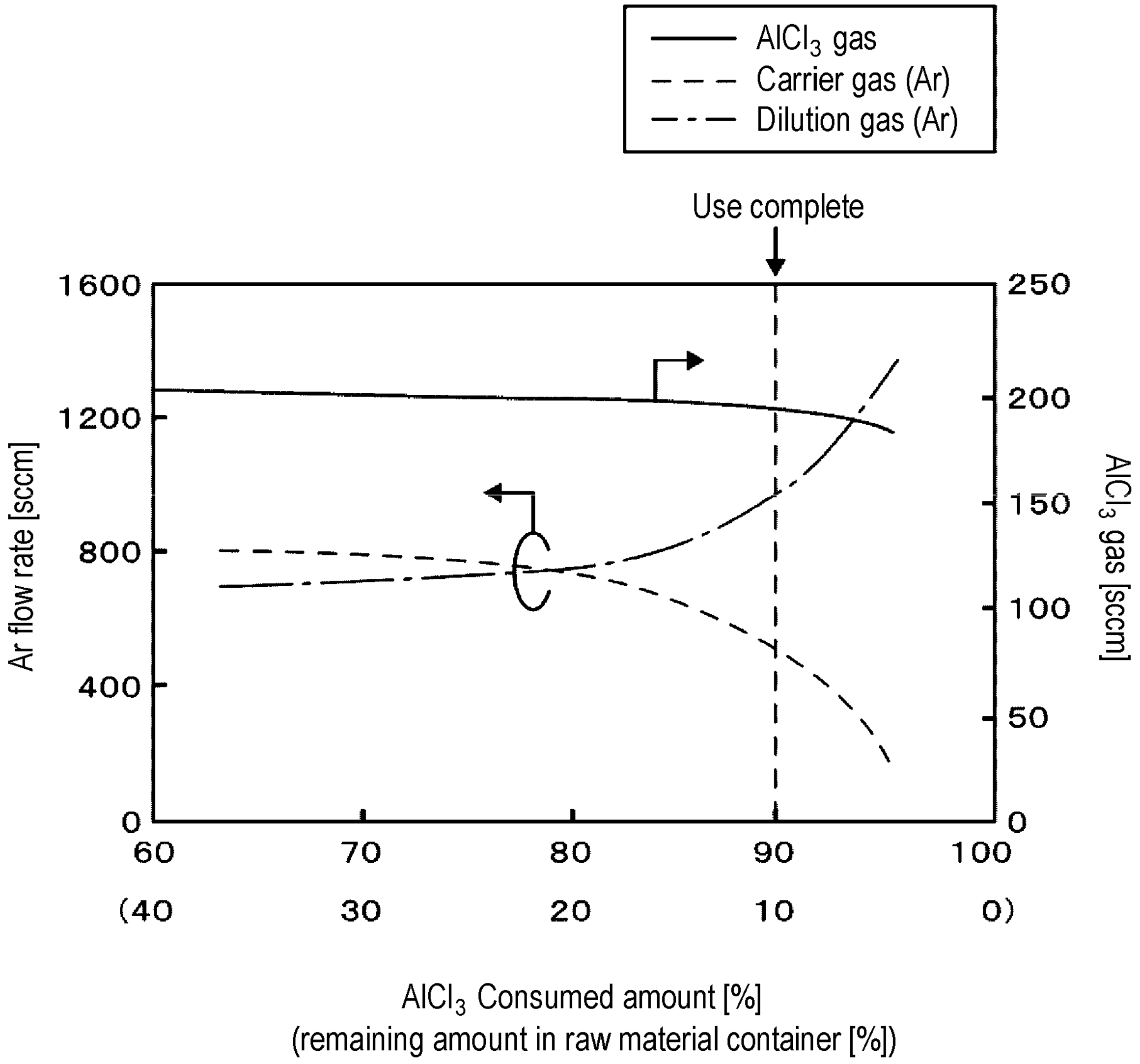
FIG. 2 is an explanatory view relating to controlling a raw material gas containing $AlCl_3$ gas.

FIG. 2 shows tendency of temporal changes of the supply flow rate of $AlCl_3$ gas (the solid line) calculated by the above-described method, the flow rate of the carrier gas (Ar) (the broken line), and the flow rate of the dilution gas (Ar) (the alternate long and short dash line) with respect to a certain raw material container 51. In addition, the horizontal axis of FIG. 2 represents both a consumed amount and a remaining amount of $AlCl_3$ in the raw material container 51, which are written above and below each other. The remaining amount [%] and the consumed amount [%] have a relationship of Equation (1) below.

$$\text{Remaining amount} = 100 - \text{Consumed amount} \quad (1)$$

As shown in FIG. 2, the raw material gas supply apparatus 12 supplies the raw material gas to the film forming apparatus 11 such that the supply flow rate of the $AlCl_3$ gas is maintained at a preset target value. In addition, at this time, the concentration of the $AlCl_3$ gas in the raw material gas is also maintained substantially constant by adjusting the supply flow rate of the raw material gas ($AlCl_3$ gas+carrier gas+dilution gas) to approach a preset target value.

Operation parameters for executing the adjustments described above may include the heating temperature of the $AlCl_3$ in the raw material container 51 by the heater 52, the flow rate of the carrier gas, and the flow rate of the dilution gas.

Here, it has been recognized that, when the heating temperature of $AlCl_3$ by the heater 52 is maintained constant, as the remaining amount of the $AlCl_3$ in the raw material container 51 decreases, the amount of the $AlCl_3$ gas flowing out to the raw material gas flow path 421 (the above-mentioned "supply flow rate of $AlCl_3$ gas") together with the carrier gas decreases. Therefore, the supply flow rate of the $AlCl_3$ gas is suppressed from decreasing by increasing the heating temperature of $AlCl_3$ according to the remaining amount of $AlCl_3$. In addition, by decreasing the flow rate of the carrier gas supplied into the raw material container 51 at normal temperature, a temperature in the raw material container 51 is suppressed from decreasing, and the adjustment to suppress a decrease in the supply flow rate of the $AlCl_3$ gas is also performed.

In addition, by increasing the supply flow rate of the dilution gas in response to the decrease in the supply flow rate of the carrier gas, the supply flow rate of the entire raw material gas is maintained substantially constant.

By adjusting the operation parameters as described above, as shown by the solid line in FIG. 2, even in the latter half of the use period of the raw material container 51, the raw material gas containing the $AlCl_3$ gas having a constant concentration can be supplied to the film forming apparatus 11 at a constant flow rate.

On the other hand, when the consumed amount of $AlCl_3$ exceeds 90% (the remaining amount falls below 10%), the supply flow rate of the $AlCl_3$ gas tends to gradually decrease even with the adjustments described above. In other words, when it is possible to determine the remaining amount of $AlCl_3$ in the raw material container 51, which has been difficult in the past, the $AlCl_3$ accommodated in each raw material container 51 can be effectively used up to 90%.

Therefore, a method of estimating the remaining amount of $AlCl_3$ in the raw material container 51 by using information that can be obtained from the raw material gas supply apparatus 12 configured as illustrated in FIG. 1 will be discussed.

As described above, when the heating temperature of $AlCl_3$ by the heater 52 is maintained constant, the supply flow rate of the $AlCl_3$ gas tends to decrease as the remaining amount of the $AlCl_3$ in the raw material container 51 decreases. Thus, when the heating temperature is maintained constant, the supply flow rate of the $AlCl_3$ gas serves as information indicating the remaining amount of the $AlCl_3$ in the raw material container 51.

On the other hand, as described with reference to FIG. 2, since the film forming apparatus 11 adjusts the supply flow rate of the $AlCl_3$ gas by increasing the heating temperature of $AlCl_3$ by the heater 52, the remaining amount of $AlCl_3$ cannot be known even when the supply flow rate of the $AlCl_3$ gas is referred to as it is.

However, when a supply flow rate of the $AlCl_3$ gas at a preset reference temperature $T_0$ (e.g., 120 degrees C. for $AlCl_3$) can be determined from the supply flow rate while excluding the influence of the change in the heating temperature by the heater 52, it becomes possible to estimate the remaining amount of $AlCl_3$ in the raw material container 51.

Figure 3:
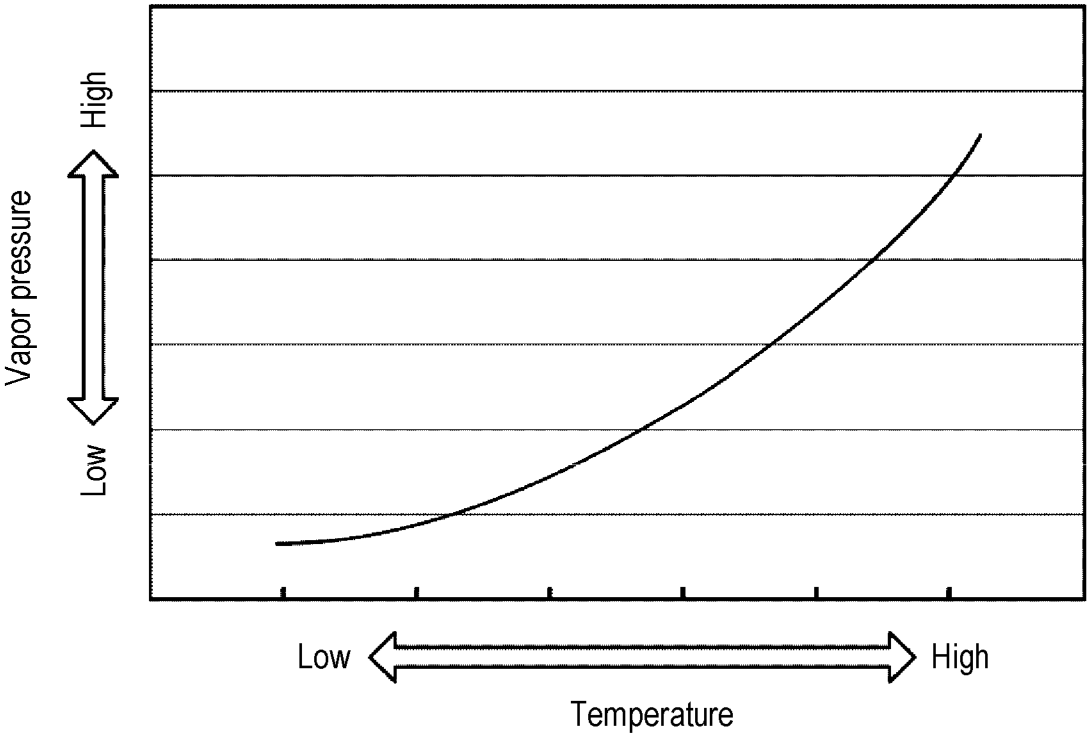
FIG. 3 illustrates a temperature-vapor pressure curve of $AlCl_3$.

FIG. 3 shows a temperature-vapor pressure curve of $AlCl_3$. Based on this temperature-vapor pressure curve, when a vapor pressure Pv of $AlCl_3$ at a certain heating temperature is obtained, the supply flow rate (supply amount per unit time) W of the $AlCl_3$ gas can be obtained from Equation (2) below.

$$W=k*\{Pv/(Pa-Pv)\}*Q \quad (2)$$

Here, k is a vaporization efficiency of $AlCl_3$ in the raw material container 51, Pa is a pressure inside the raw material container 51, and Q is a flow rate of the carrier gas.

The value of the vaporization efficiency k in Equation (2) described above changes over time according to the remaining amount of $AlCl_3$ in the raw material container 51 and the like. Therefore, from the supply flow rate of the $AlCl_3$ gas calculated by the method described with reference to FIG. 2 and a vapor pressure of $AlCl_3$ at an actual heating temperature, the vaporization efficiency k at that time is calculated by using Equation (2). From the vaporization efficiency k obtained as described above and the vapor pressure of $AlCl_3$ at the preset reference temperature $T_0$, a reference temperature supply amount, which is a supply amount of the raw material per unit time when it is assumed that the $AlCl_3$ is heated at the reference temperature $T_0$, can be obtained by using Equation (2).

The above-described calculation corresponds to a process of converting the supply flow rate of the $AlCl_3$ gas into the reference temperature supply amount.

In addition, the method of converting the supply flow rate of the $AlCl_3$ gas into the reference temperature supply amount is not limited to the above-described example. For example, there may be a method of obtaining, with respect to a ratio R of the supply flow rate of the $AlCl_3$ gas to the reference temperature supply rate, a correction curve, which represents a change in the supply flow rate ratio R relative to the heating temperature, in advance. In this case, a value of the supply flow rate ratio R corresponding to the reference temperature is read from the correction curve. Then, the actual supply flow rate of the $AlCl_3$ gas is divided by the flow rate ratio "R" at that heating temperature. By this calculation, the supply flow rate of the $AlCl_3$ gas can be converted into the reference temperature supply amount.

Figure 4:
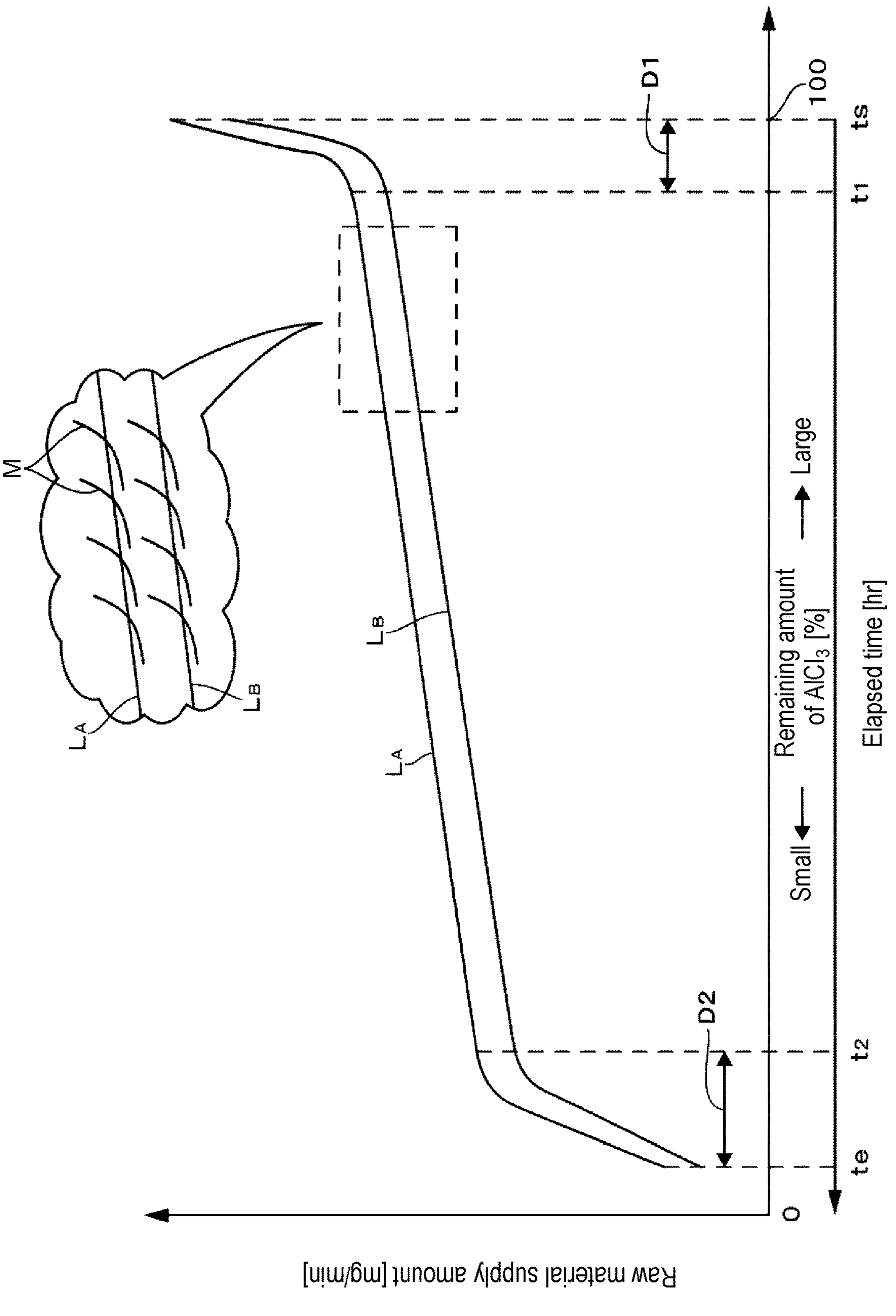
FIG. 4 illustrates remaining amount-raw material supply amount curves, each of which shows a relationship between a remaining amount of $AlCl_3$ in a raw material container and a supply amount of $AlCl_3$.

FIG. 4 illustrates examples of remaining amount-raw material supply amount curves, each of which shows a relationship between the remaining amount of $AlCl_3$ in raw material containers 51 and the supply amount of $AlCl_3$ per unit time, which is calculated based on the above-described method. The horizontal axis of FIG. 4 represents, in addition to the remaining amount of $AlCl_3$, an elapsed time from the start of using the raw material container 51 (time elapses along the leftward arrow). In addition, the vertical axis represents a mass-based supply amount of $AlCl_3$ per unit time [mg/min], instead of the volume-based supply flow rate used in the right-hand side vertical axis of FIG. 2.

According to the remaining amount-raw material supply amount curves shown in FIG. 4, as a general tendency, the supply amount of $AlCl_3$ per unit time tends to decrease as the remaining amount of $AlCl_3$ in the raw material container 51 decreases. In addition, an initial section belonging to a period in which the remaining amount of $AlCl_3$ falls within a range of 100% or less and 90% or more, and an ending section belonging to a period in which the remaining amount falls within a range of 50% or less and 0% or more include sections D1 and D2, respectively, in which a decrease amount in the raw material supply amount per unit decrease amount in the remaining amount is larger than the other sections.

In this case, when the reference temperature supply amount calculated by the method described with reference to FIGS. 2 and 3 is obtained, the remaining amount of $AlCl_3$ in the raw material container 51 can be estimated by using the remaining amount-raw material supply amount curve shown in FIG. 4.

Meanwhile, the actual supply amount of $AlCl_3$ per unit time (the supply flow rate of the $AlCl_3$ gas) may be affected not only by the heating temperature by the heater 52 but also by various parameters. These parameters may include, for example, the flow rate of the carrier gas described with reference to FIG. 2, a total weight of $AlCl_3$ filled in the raw material container 51, a volume of the raw material container 51, an internal pressure of the raw material container 51, the number of trays provided in the raw material container 51 to hold $AlCl_3$, a total time during which the carrier gas is supplied to the raw material container 51, the number of wafers W processed in the film forming apparatus 11, and the like.

In addition, parameters such as a particle size or a surface area of $AlCl_3$ when granular $AlCl_3$ is filled as the solid raw material, and characteristics of each of a plurality of raw material containers 51 when the plurality of raw material containers 51 is used interchangeably may also be a cause changing the supply amount of $AlCl_3$.

Therefore, after setting the parameters with actual operating conditions of the film forming system 1, the remaining amount-raw material supply amount curves shown in FIG. 4 are obtained in advance by a preliminary experiment in which the heating temperature of $AlCl_3$ is set to be constant. The remaining amount-raw material supply amount curves are obtained for respective raw material containers 51, which are used interchangeably.

In the preliminary experiment, the remaining amount may be specified by, for example, measuring a weight of each of the raw material containers 51 accommodating $AlCl_3$ at predetermined time intervals. In addition, the remaining amount may be specified by Equation (1) described above by continuously measuring the content of $AlCl_3$ gas in the raw material gas by an online analyzer or the like and obtaining the consumed amount from a time-integrated value of the continuously measured content.

As a result, as shown in FIG. 4, a plurality of remaining amount-raw material supply amount curves $L_A$ and $L_B$ reflecting inherent characteristics of the respective raw material containers 51 can be obtained.

However, even when using the remaining amount-raw material supply amount curves $L_A$ and $L_B$ reflecting various parameters as described above, it may be difficult to estimate the remaining amount of $AlCl_3$ accurately. One of the main reasons for this is an influence of repeatedly stopping and resuming the supply of the raw material gas.

The film forming system 1 including the raw material gas supply apparatus 12 may stop operations thereof every few days to several weeks and may restart the operations after inspection or maintenance. Therefore, the film forming apparatus 11 repeats stopping and resuming the supply of the raw material gas according to such a schedule. While the supply of the raw material gas is stopped, heating of the $AlCl_3$ accommodated in the raw material container 51 is stopped, and execution of respective operations for supplying the raw material gas is stopped. In addition, in response to resuming the supply of the raw material gas, the heating of the $AlCl_3$ is restarted, and the respective operations for supplying the raw material gas are executed.

In a case where the operations described above are carried out, as shown in curves M illustrated in the enlarged view of FIG. 4, a phenomenon in which the raw material supply amount per unit time becomes larger than that on each of the remaining amount-raw material supply amount curves $L_A$ and $L_B$, which have already been described above, may occur immediately after the heating of the $AlCl_3$ is restarted. In the actual operations of the film forming system 1, such a period is an idling period, in which the film forming process on the wafer W may not be started.

Thereafter, with a lapse of time after resuming the operations, the raw material supply amount gradually converges to values according to the remaining amount-raw material supply amount curves $L_A$ and $L_B$.

However, when the remaining amount of $AlCl_3$ is estimated during the period in which the raw material supply amount fluctuates due to resuming the heating of $AlCl_3$ as described above, there is a possibility that it becomes difficult to determine the accurate remaining amount. For example, FIG. 5 illustrates, with respect to a remaining amount-raw material supply amount curve L indicated by the alternate long and short dash line, raw material supply amount curves M(n) and M(n+1) according to an $n_{th}$ and $(n+1)_{th}$ resumption of the operations, respectively.

At this time, even in case where the raw material supply amount corresponding to a remaining amount Z(n) on the curve M(n) or a remaining amount Z(n+1) on the curve M(n+1) is actually detected, when the estimation is made based only on the remaining amount-raw material supply amount curve L, an incorrect remaining amount $Z_F$ will be specified.

Figure 5:
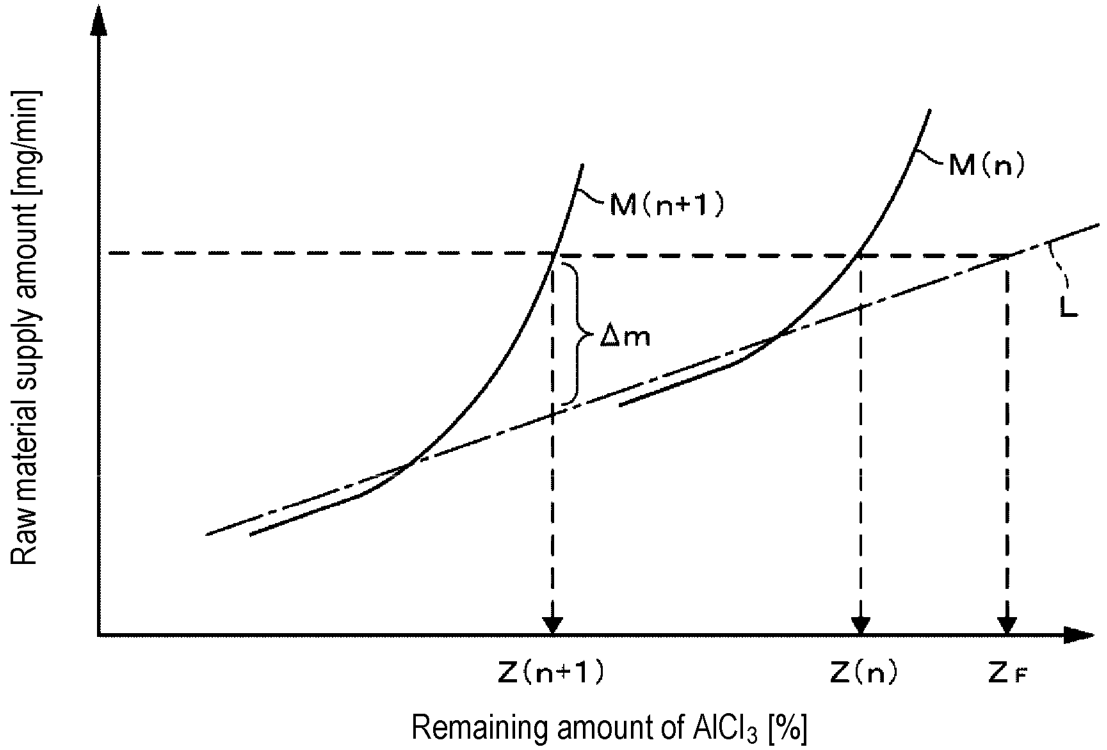
FIG. 5 is an explanatory view of correction curves of a remaining amount-raw material supply amount curve.

Therefore, during the period in which the influence of fluctuations according to resuming the heating of $AlCl_3$ is large, accurate remaining amounts Z(n) and Z(n+1) may be estimated by using correction curves (M(n) and M(n+1) in FIG. 5), which are remaining amount-raw material supply amount curves corresponding to the number of times of resuming the heating and reflecting the influence of the above-mentioned fluctuations.

As a method of obtaining the correction curve M, a temporal change of a deviation amount $\Delta m$ of the raw material supply amount from the remaining amount-raw material supply amount curve L may be determined, and then, for a predetermined period after resuming the heating, the correction curve M may be created by adding the deviation amount $\Delta m$ to the remaining amount-raw material supply amount curve L.

In addition, the correction curve M(n) (n=1, 2, 3 . . . ) may be actually obtained by repeating the starting and resuming the heating of $AlCl_3$ by the raw material gas supply apparatus 12 during a preliminary experiment for obtaining the remaining amount-raw material supply amount curve L.

In addition, in the initial section D1 and the ending section D2 described above with reference to FIG. 4, the remaining amount may also be estimated by using the correction curve M. The influence of starting the heating of $AlCl_3$ may be taken into consideration in the initial section D1 of the remaining amount-raw material supply amount curve L, and estimation of the remaining amount using the correction curve M may not be necessary. In addition, the raw material container 51 may be replaced before reaching the ending section D2. In such cases, estimating the remaining amount using the correction curve M in the initial section D1 and the ending section D2 may not be performed.

The remaining amount-raw material supply amount curves $L_A$ and $L_B$, the deviation amount Δm of the raw material supply amount, and the correction curve M described above are stored in the memory of the controller 200. The controller 200 reads out these curves according to preset timings. Then, based on the curves, the remaining amount of $AlCl_3$ in the raw material container 51 corresponding to the supply amount of $AlCl_3$ per unit time, which is calculated by using the mass flow controllers 36 and 331 and the mass flow meter 341, is obtained.

Figure 6:
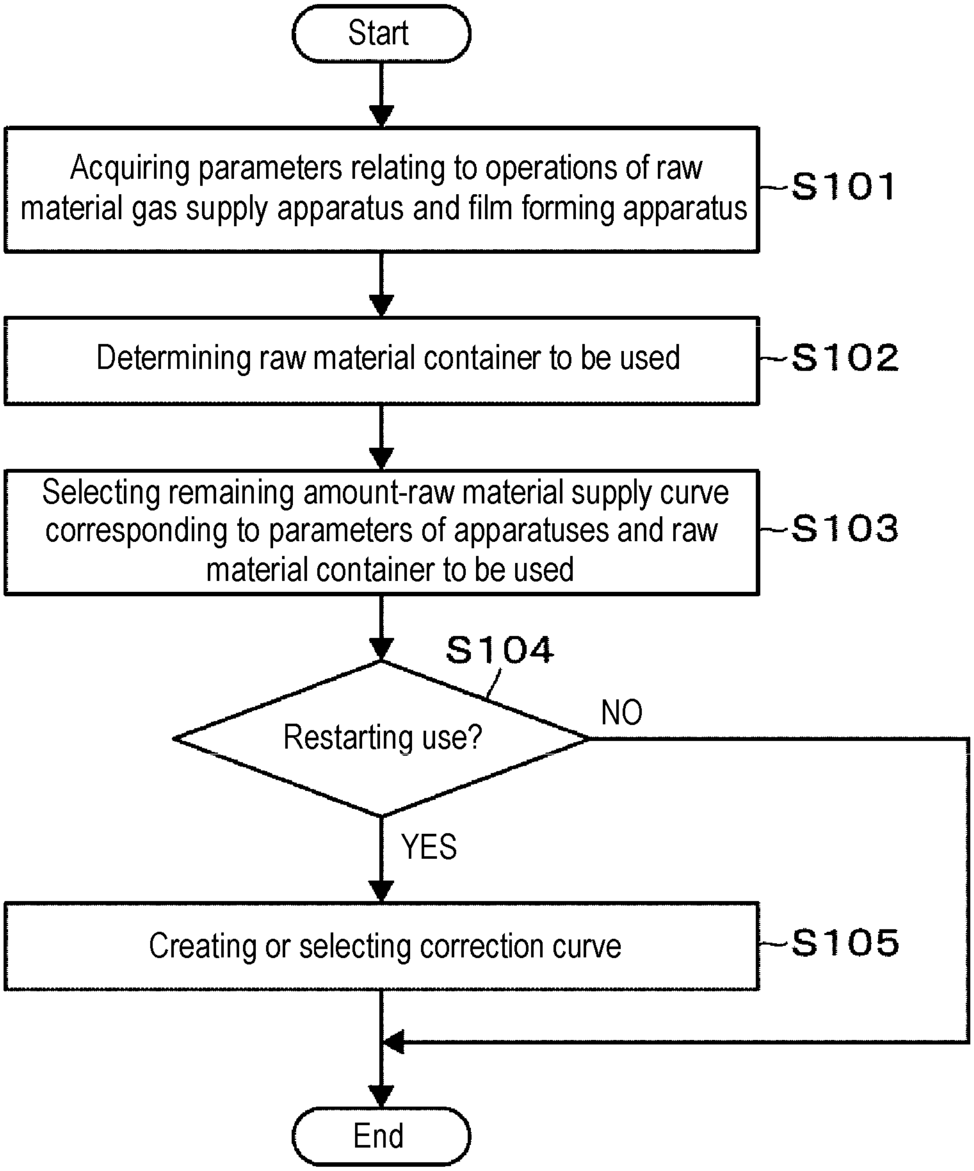
FIG. 6 is a flowchart illustrating a flow of operations of generating and selecting a remaining amount-raw material supply amount curve.
Figure 7:
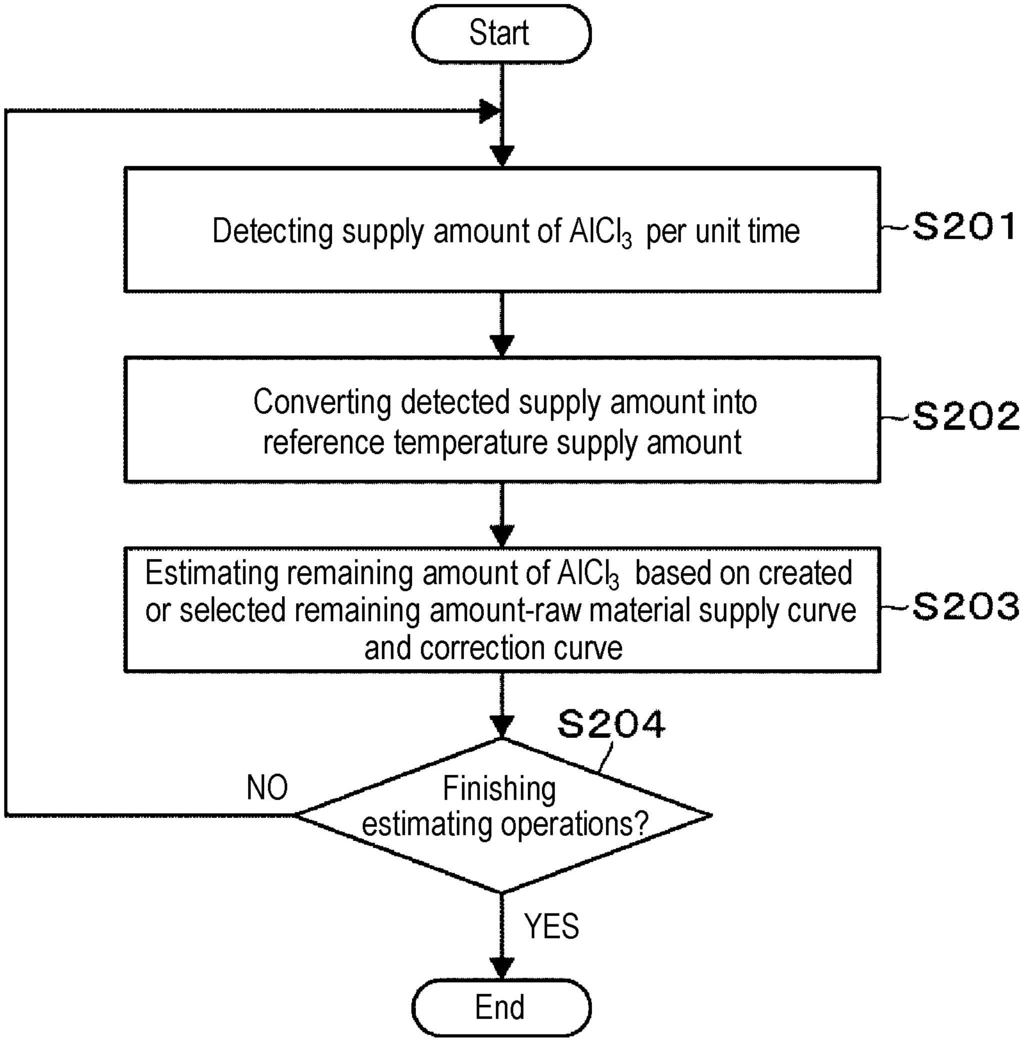
FIG. 7 is a flowchart illustrating a flow of operations of estimating a remaining amount of $AlCl_3$ in the raw material container.

Hereinafter, a flow of operations of obtaining the remaining amount of $AlCl_3$ in the raw material container 51 will be described with reference to FIGS. 6 and 7. FIG. 6 illustrates a flow of operations of selecting and creating the remaining amount-raw material supply amount curve L and the correction curve M, and FIG. 7 illustrates a flow of operations of estimating the remaining amount by using these curves.

First, as illustrated in FIG. 6, parameters, which relate to operations of the raw material gas supply apparatus 12 and the film forming apparatus 11 when the use of a replaced raw material container 51 is started or the supply of the raw material gas after maintenance or the like is started ("START"), are acquired (step S101). Subsequently, the raw material container 51 to be used from then on is determined by, for example, obtaining an identification number associated in advance with the raw material container 51, which is accommodated in the raw material gas supplier 5 (step S102).

Thereafter, a remaining amount-raw material supply amount curve corresponding to the parameters and the raw material container 51 to be used is selected (step S103). At this time, when it is not necessary to use a correction curve M (step S104; "NO") because a time point of the selection is in the initial section D1 or the ending section D2 or the heating of $AlCl_3$ continues, the operations are terminated as it is ("END").

On the other hand, when the time point of the selection is a time to restart the use of the film forming system 1 (restarting the heating of $AlCl_3$) (step S104; "YES"), a correction curve M is created or selected (step S105), and the operations are terminated ("END").

Next, as illustrated in FIG. 7, when the heating of $AlCl_3$ and the supply of the carrier gas and the dilution gas are started, and the supply of the raw material gas toward the raw material gas supply apparatus 12 is started ("START"), the supply amount of $AlCl_3$ per unit time is detected (step S201). Subsequently, the detected supply amount is converted into a reference temperature supply amount at a reference temperature $T_0$ by the method described with reference to FIG. 3 (step S202).

Thereafter, based on the remaining amount-raw material supply curve L and the correction curve M created and selected in the operations of FIG. 6, the remaining amount of $AlCl_3$ in the raw material container 51 corresponding to the reference temperature supply amount is estimated by the method described with reference to FIGS. 5 and 6 (step S203).

The estimated remaining amount may be stored in the memory, and the most recent remaining amount or a temporal change in the remaining amount may be output to a monitor or the like in response to a request from an operator of the film forming system 1 or the like. In addition, an alarm or the like may be issued when the remaining amount of $AlCl_3$ reaches, for example, 10%.

Then, during a period in which the raw material gas is supplied to the film forming apparatus 11 and the estimation operations need to be executed (step S204; "NO"), the above-described operations are repeated (steps S201 to S203). When it is a timing to finish estimating the remaining amount (step S204; "YES") in order to stop the film forming system 1 or perform a replacement work of the raw material container 51, the operations are terminated ("END").

With the raw material gas supply apparatus 12 according to the present embodiment, the remaining amount of $AlCl_3$ in the raw material container 51 in which $AlCl_3$ as the solid raw material is sublimated to obtain the raw material can be estimated. As a result, while avoiding replacing the raw material container 51 in a state in which a relatively large amount of unused $AlCl_3$ remains, $AlCl_3$ accommodated in each raw material container 51 can be used effectively.

Figure 8:
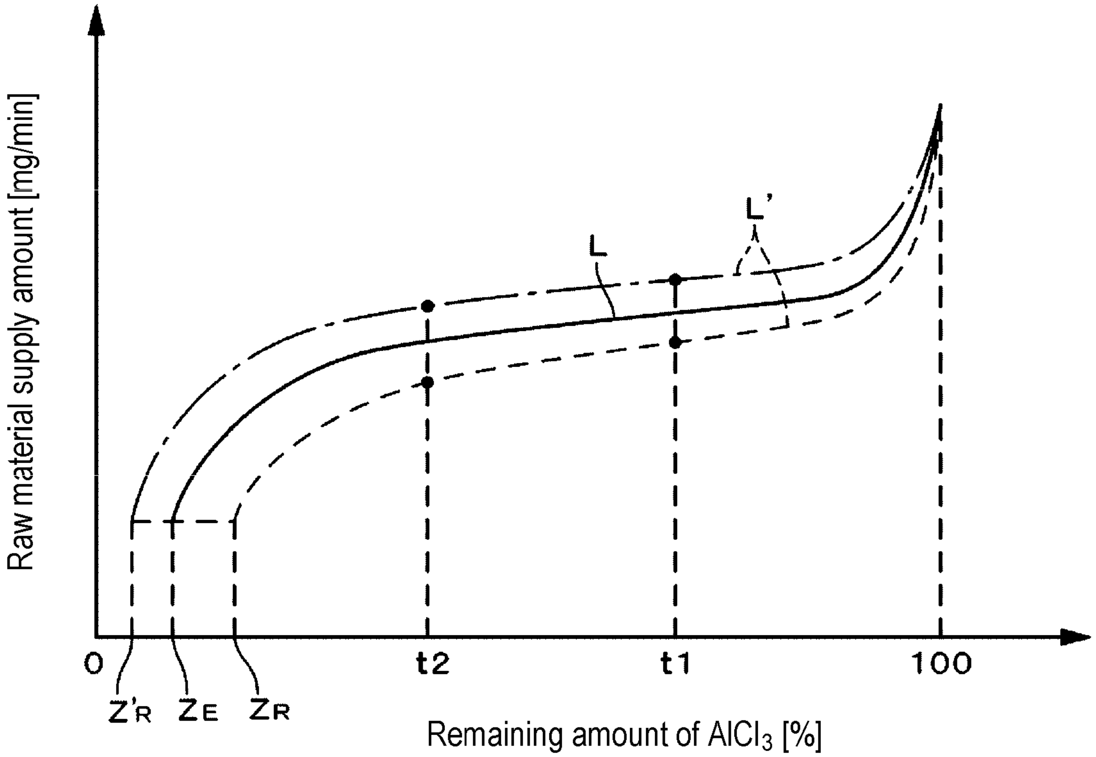
FIG. 8 is an explanatory view relating to a method of correcting a remaining amount-raw material supply amount curve based on a result of comparison with actual remaining amounts.

FIG. 8 illustrates an example of a method of comparing an estimation result of the remaining amount of $AlCl_3$ during a use of the raw material container 51 and actual remaining amounts $Z_R$ and $Z'_R$ confirmed by opening the raw material container 51 separated from the film forming apparatus 11, and correcting the remaining amount-raw material supply amount curve L used for estimating the remaining amount based on the comparison result.

It is assumed that, with respect to a remaining amount $Z_E$ estimated at a time of replacing the raw material containers 51 by using the remaining amount-raw material supply amount curve L indicated by the solid line in FIG. 8, the remaining amounts $Z_R$ and $Z'_R$ are actually confirmed. In this case, corrected remaining amount-raw material supply amount curves L' may be obtained, for example, by changing the remaining amounts corresponding to the raw material supply amounts at time points t1 and t2 such that the estimated remaining amount $Z_E$ coincides with the actual remaining amount $Z_R$ or $Z'_R$, without changing the raw material supply amounts when the remaining amount is 100%. At this time, in order to suppress the influence of fluctuations in each use period, an average value of the remaining amounts confirmed by using the raw material container 51 multiple times may be used as the remaining amounts $Z_R$ and $Z'_R$.

In addition, the estimation result of the remaining amount of $AlCl_3$ in the raw material container 51 obtained by using the remaining amount-raw material supply amount curve L may be used to control operations of the raw material gas supply apparatus 12. For example, as described above, instead of the method of heating $AlCl_3$ in the raw material container 51, a heating control using the estimation result of the remaining amount may be performed such that the supply flow rate of the $AlCl_3$ gas obtained by subtracting the flow rates of the carrier gas and the dilution gas from the flow rate of a raw material gas is constant.

As a specific example, the remaining amount of $AlCl_3$ in the raw material container 51 may be estimated over time, and the heating temperature of the $AlCl_3$ may be adjusted such that an amount of change (change rate) in the remaining amount per unit time obtained as the estimation result approaches a preset target value. As described above by using Equation (1), the remaining amount corresponds to the consumed amount of $AlCl_3$. Thus, the supply flow rate of the $AlCl_3$ gas may be controlled by adjusting the heating temperature such that the change rate of the remaining amount is constant.

In the above-described embodiment, a case where $AlCl_3$ gas is supplied from the raw material gas supply apparatus 12 to the film forming apparatus 11 has been described. However, the type of raw material that is capable of being supplied by using the raw material gas supply apparatus 12 according to the present disclosure is not limited to the example of $AlCl_3$.

For example, the technique of the present disclosure may also be applied to a raw material gas supply apparatus 12 that supplies a raw material gas containing $WCl_6$ gas to a film forming apparatus 11 in which $WCl_6$ and $H_2$ react with each other to form a tungsten W film on a wafer W. In this case, a remaining amount-raw material supply amount curve L different from that for $AlCl_3$ is obtained.

In addition, as a raw material that is capable of being supplied by the raw material gas supply apparatus 12 of the present embodiment, a raw material which is in a solid state when filled into the raw material container may be used, and an example may include Ni(II), N'-di-tertiary-butylamidinate (Ni(II)(tBu-AMD)$_2$ (hereinafter, referred to as "Ni (AMD)$_2$"), in addition to the above-mentioned $WCl_6$. When Ni(AMD)$_2$ is used as the raw material, a nickel (Ni) film is formed on the surface of the wafer 100 by using ammonia gas as a reaction gas (a reducing gas).

Ni(AMD)$_2$ is in a solid state when filled into a raw material container, but may vaporize via a liquid state when heated. In the present disclosure, not only sublimation from a solid state, but also a generation path of a gaseous raw material, in which a solid raw material is first liquefied and then vaporized in the raw material containers 51, is also referred to as "sublimation of a solid raw material" for convenience.

In addition, a configuration of the film forming apparatus 11 may be, in addition to a single wafer type in which wafers are placed sheet by sheet on a stage and a film forming process is performed, a batch type in which wafers are held in a wafer boat that holds a plurality of wafers and a film forming process is performed. In addition, a semi-batch type configuration, in which a plurality of wafers is arranged on a rotating stage and a film forming process is performed, may be used.

In addition, the film forming apparatus 11 of the present disclosure is not limited to a configuration for executing an ALD method. For example, a film formation part that executes a CVD method may be adopted as long as it is configured to use the film forming apparatus 11 of the present example. In addition, the raw material gas supply apparatus of the present disclosure is also applicable to a case where a raw material obtained by sublimating a solid raw material is supplied to an etching apparatus or a heating apparatus, which is a consumption region, as an etching gas or a heat treatment gas, together with a carrier gas.

It should be considered that the embodiments disclosed herein are exemplary in all respects and not restrictive. The embodiments described above may be omitted, replaced, or modified in various forms without departing from the scope and spirit of the appended claims.

EXPLANATION OF REFERENCE NUMERALS

W: wafer, 12: raw material gas supply apparatus, 200: controller, 421: raw material gas flow path, 5: raw material gas supplier, 51: raw material container, 52: heater, 722: bypass flow path

What is claimed is:

1. A method of estimating a remaining amount of a solid raw material in a raw material container, the method comprising:

an act of obtaining a raw material by heating the solid raw material accommodated in the raw material container to sublimate the solid raw material;

an act of supplying a carrier gas into the raw material container to supply the carrier gas together with the sublimated raw material as a raw material gas to a consumption region;

an act of adjusting a heating temperature of the solid raw material based on a result obtained by measuring an amount of the raw material in the raw material gas supplied to the consumption region;

an act of converting a supply amount of the raw material per unit time into a reference temperature supply amount, which is a supply amount of the raw material per unit time when the solid raw material is heated at a preset reference temperature; and an act of estimating, by a controller, the remaining amount of the solid raw material corresponding to the reference temperature supply amount based on a remaining amount-raw material supply amount curve, which is stored in advance in a memory of the controller and indicates a relationship between the remaining amount of the solid raw material in the raw material container and the raw material supply amount when the solid raw material is heated at the reference temperature.

2. The method of claim 1, wherein the act of estimating the remaining amount of the solid raw material includes using different remaining amount-raw material supply amount curves according to a type of the solid raw material accommodated in the raw material container.

3. The method of claim 2, wherein after the remaining amount of the solid raw material accommodated in the raw material container decreases, the raw material container is replaced with another raw material container accommodating the solid raw material, and wherein the act of estimating the remaining amount of the solid raw material includes using different remaining amount-raw material supply amount curves according to the raw material containers, respectively.

4. The method of claim 3, wherein an initial section and an ending section of the remaining amount-raw material supply amount curve include sections in which a decrease amount in the raw material supply amount relative to a unit decrease amount in the remaining amount is larger than other sections, the initial section being a period in which the remaining amount of the solid raw material falls within a range of 100% or less and 90% or more, and the ending section being a period in which the remaining amount falls within a range of 50% or less and 0% or more.

5. The method of claim 4, wherein the respective acts are executed by:

repeating stopping and restarting the supply of the raw material gas to the consumption region;

during the stop of the supply of the raw material gas, stopping the heating of the solid raw material accommodated in the raw material container, and stopping execution of the respective acts; and in response to the restart of the supply of the raw material, restarting the heating of the solid raw material, and wherein the act of estimating the remaining amount of the solid raw material includes a period of using a correction curve, which is a remaining amount-raw material supply amount curve corrected in consideration of influence of a fluctuation according to the restart of the heating of the solid raw material.

6. The method of claim 5, further comprising:

an act of comparing the remaining amount estimated in the act of estimating the remaining amount of the solid raw material with an actual remaining amount of the solid raw material remaining in the raw material container; and an act of correcting the remaining amount-raw material supply amount curve based on the comparison result.

7. The method of claim 1, wherein after the remaining amount of the solid raw material accommodated in the raw material container decreases, the raw material container is replaced with another raw material container accommodating the solid raw material, and wherein the act of estimating the remaining amount of the solid raw material includes using different remaining amount-raw material supply amount curves according to the raw material containers, respectively.

8. The method of claim 1, wherein an initial section and an ending section of the remaining amount-raw material supply amount curve include sections in which a decrease amount in the raw material supply amount relative to a unit decrease amount in the remaining amount is larger than other sections, the initial section being a period in which the remaining amount of the solid raw material falls within a range of 100% or less and 90% or more, and the ending section being a period in which the remaining amount falls within a range of 50% or less and 0% or more.

9. The method of claim 1, wherein the respective acts are executed by:

repeating stopping and restarting the supply of the raw material gas to the consumption region;

during the stop of the supply of the raw material gas, stopping the heating of the solid raw material accommodated in the raw material container, and stopping execution of the respective acts; and in response to the restart of the supply of the raw material, restarting the heating of the solid raw material, and wherein the act of estimating the remaining amount of the solid raw material includes a period of using a correction curve, which is a remaining amount-raw material supply amount curve corrected in consideration of influence of a fluctuation according to the restart of the heating of the solid raw material.

10. The method of claim 1, further comprising:

an act of comparing the remaining amount estimated in the act of estimating the remaining amount of the solid raw material with an actual remaining amount of the solid raw material remaining in the raw material container; and an act of correcting the remaining amount-raw material supply amount curve based on the comparison result.

11. A method of forming a film by supplying a raw material gas to a substrate, the method comprising:

while estimating the remaining amount of the solid raw material remaining in the raw material container by the method of claim 1, forming the film on the substrate disposed in a processing container, which is the consumption region, with the raw material gas supplied to the processing container.

12. An apparatus for sublimating a solid raw material in a raw material container and supplying the sublimated raw material as a raw material gas, the apparatus comprising:

a raw material container configured to accommodate the solid raw material and provided with a heater configured to heat the solid raw material;

a carrier gas introduction path configured to introduce a carrier gas into the raw material container;

a raw material gas flow path provided between the raw material container and a consumption region of the raw material gas;

a measurer configured to measure an amount of raw material in the raw material gas; and a controller, wherein the controller is configured to output control signal for executing:

an act of obtaining the raw material by heating, by the heater, the solid raw material accommodated in the raw material container to sublimate the solid raw material;

an act of supplying the carrier gas from the carrier gas introduction path to the raw material container, causing the carrier gas and the sublimated raw material to be joined with each other to form the raw material gas, and supplying the raw material gas to the consumption region via the raw material gas flow path;

an act of adjusting, by the heater, a heating temperature of the solid raw material based on a result obtained by measuring, by the measurer, an amount of the raw material in the raw material gas supplied to the consumption region;

an act of converting a supply amount of the raw material per unit time into a reference temperature supply amount, which is a supply amount of the raw material per unit time when the solid raw material is heated at a preset reference temperature; and an act of estimating the remaining amount of the solid raw material corresponding to the reference temperature supply amount based on a remaining amount-raw material supply amount curve, which is acquired in advance and indicates a relationship between the remaining amount of the solid raw material in the raw material container and the raw material supply amount when the solid raw material is heated at the reference temperature.

13. The apparatus of claim 12, wherein the act of estimating the remaining amount of the solid raw material includes using different remaining amount-raw material supply amount curves according to a type of the solid raw material accommodated in the raw material container.

14. The apparatus of claim 13, wherein, after the remaining amount of the solid raw material accommodated in the raw material container decreases, the raw material container is replaced with another raw material container accommodating the solid raw material, and wherein the act of estimating the remaining amount of the solid raw material includes using different remaining amount-raw material supply amount curves according to the raw material containers, respectively.

15. The apparatus of claim 14, wherein an initial section and an ending section of the remaining amount-raw material supply amount curve include sections in which a decrease amount in the raw material supply amount relative to a unit decrease amount in the remaining amount is larger than other sections, the initial section being a period in which the remaining amount of the solid raw material falls within a range of 100% or less and 90% or more, and the ending section being a period in which the remaining amount falls within a range of 50% or less and 0% or more.

16. The apparatus of claim 15, wherein the respective acts are executed by:

repeating stopping and restarting of the supply of the raw material gas to the consumption region;

during the stop of the supply of the raw material gas, stopping the heating of the solid raw material accommodated in the raw material container, and stopping execution of the respective acts; and in response to the restart of the supply of the raw material, restarting the heating of the solid raw material, and wherein the act of estimating the remaining amount of the solid raw material includes a period of using a correction curve, which is a remaining amount-raw material supply amount curve corrected in consideration of influence of a fluctuation according to the restart of the heating of the solid raw material.

17. The apparatus of claim 16, wherein the controller is further configured to output control signals for executing:

an act of comparing the remaining amount estimated in the act of estimating the remaining amount of the solid raw material with an actual remaining amount of the solid raw material remaining in the raw material container; and an act of correcting the remaining amount-raw material supply amount curve based on the comparison result.

18. The apparatus of claim 12, wherein, after the remaining amount of the solid raw material accommodated in the raw material container decreases, the raw material container is replaced with another raw material container accommodating the solid raw material, and wherein the act of estimating the remaining amount of the solid raw material includes using different remaining amount-raw material supply amount curves according to the raw material containers, respectively.

19. The apparatus of claim 12, wherein an initial section and an ending section of the remaining amount-raw material supply amount curve include sections in which a decrease amount in the raw material supply amount relative to a unit decrease amount in the remaining amount is larger than other sections, the initial section being a period in which the remaining amount of the solid raw material falls within a range of 100% or less and 90% or more, and the ending section being a period in which the remaining amount falls within a range of 50% or less and 0% or more.

20. An apparatus of forming a film by supplying a raw material gas to a substrate, the apparatus comprising:

a processing container configured to accommodate the substrate, wherein the apparatus is further configured to execute, while estimating the remaining amount of the solid raw material remaining in the raw material container by the apparatus of claim 12, an act of forming the film on the substrate disposed in the processing container, which is the consumption region, with the raw material gas supplied to the processing container.

* * * * *